United States Patent
Duan et al.

(10) Patent No.: US 11,538,748 B2
(45) Date of Patent: Dec. 27, 2022

(54) SEMICONDUCTOR DEVICE WITH CAPACITOR ELEMENT

(71) Applicant: MediaTek Singapore Pte. Ltd., Singapore (SG)

(72) Inventors: Zhigang Duan, Singapore (SG); Jinghao Chen, Singapore (SG)

(73) Assignee: MEDIATEK SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 17/226,330

(22) Filed: Apr. 9, 2021

(65) Prior Publication Data

US 2021/0384117 A1 Dec. 9, 2021

Related U.S. Application Data

(60) Provisional application No. 63/034,450, filed on Jun. 4, 2020.

(51) Int. Cl.
| | |
|---|---|
| *H01L 23/522* | (2006.01) |
| *H01L 23/48* | (2006.01) |
| *H01L 23/528* | (2006.01) |
| *H01L 23/538* | (2006.01) |
| *H01L 25/18* | (2006.01) |
| *H01L 23/64* | (2006.01) |
| *H01L 49/02* | (2006.01) |

(52) U.S. Cl.
CPC ........ *H01L 23/5223* (2013.01); *H01L 23/481* (2013.01); *H01L 25/18* (2013.01); *H01L 28/91* (2013.01)

(58) Field of Classification Search
CPC . H01L 23/5223; H01L 23/642; H01L 23/481; H01L 23/5386; H01L 23/5283; H01L 28/91

See application file for complete search history.

(56) References Cited

U.S. PATENT DOCUMENTS

| | | |
|---|---|---|
| 7,564,116 B2 | 7/2009 | Ahn et al. |
| 7,960,773 B2 | 6/2011 | Chang et al. |
| 2008/0042181 A1 | 2/2008 | Watarai et al. |

(Continued)

FOREIGN PATENT DOCUMENTS

| | | |
|---|---|---|
| CN | 1829420 A | 9/2006 |
| KR | 10-2010-0085391 A | 7/2010 |

OTHER PUBLICATIONS

European Search Report dated Oct. 11, 2021, issued in application. EP 21170579.3.

(Continued)

*Primary Examiner* — Omar F Mojaddedi
(74) *Attorney, Agent, or Firm* — McClure, Qualey & Rodack, LLP

(57) ABSTRACT

A semiconductor device includes a substrate and at least one capacitor element. The capacitor element is on the substrate. The capacitor element includes a first electrode with a first pad and first terminals connected to the first pad, wherein the first terminals extend away from the substrate; and a second electrode with a second pad and second terminals connected to the second pad, wherein the second terminals extend toward the substrate, wherein the first terminals and the second terminals are staggered and separated by an interlayer dielectric layer.

10 Claims, 6 Drawing Sheets

(56) References Cited

U.S. PATENT DOCUMENTS

| | | | |
|---|---|---|---|
| 2008/0110667 A1* | 5/2008 | Ahn | H05K 1/162 |
| | | | 174/257 |
| 2012/0086683 A1* | 4/2012 | Segura Puchades | |
| | | | H01L 23/5223 |
| | | | 345/87 |
| 2013/0234291 A1* | 9/2013 | Miyamoto | H01L 28/86 |
| | | | 257/534 |
| 2014/0264742 A1* | 9/2014 | Yen | H01L 28/91 |
| | | | 257/532 |
| 2016/0020267 A1 | 1/2016 | Lin | |
| 2016/0276324 A1* | 9/2016 | Lin | H01L 23/5389 |
| 2019/0057949 A1* | 2/2019 | Hwang | H01L 23/5223 |
| 2019/0103227 A1* | 4/2019 | Lu | H01L 28/91 |

OTHER PUBLICATIONS

Chinese language office action dated May 30, 2022, issued in application No. TW 110119760.

* cited by examiner

SEMICONDUCTOR DEVICE WITH CAPACITOR ELEMENT

CROSS REFERENCE TO RELATED APPLICATIONS

This application claims the benefit of U.S. Provisional Application No. 63/034,450 filed on Jun. 4, 2020, the entirety of which is incorporated by reference herein.

BACKGROUND

Field of the Disclosure

The present disclosure relates to a semiconductor device, and in particular, to a semiconductor device with a capacitor element.

Description of the Related Art

Semiconductor devices can be applied in various fields, such as smart TVs, voice assistant devices (VAD), tablets, feature phones, smartphones, optical and Blu-ray DVD players, and so on. Semiconductor devices are typically manufactured in the following manner: sequentially depositing an insulation or dielectric layer, a conductive layer, and a semiconductor material layer on a semiconductor substrate, and patterning the various material layers by using lithography and etching technique to forming circuit components and elements thereon.

In an effort to continue the scaling-down process of semiconductor devices, the functional density (i.e., the number of interconnected devices per chip area) has generally increased while geometric size (i.e., the smallest component (or line) that can be created using the fabrication process) has decreased. This scaling-down process generally provides benefits by improving production efficiency and performance of semiconductor devices, and lowering associated costs as well. Such scaling down has also been accompanied by increased complexity in design and manufacturing of semiconductor devices. Parallel advances in manufacturing have allowed increasingly complex designs to be fabricated with precision and reliability.

However, numerous challenges have arisen in the effort to continue the scaling-down of semiconductor devices. For example, fluctuations (or noises) in power supply (or being referred to power supply noise) adversely affect performance of semiconductor devices. To reduce power supply noise, decoupling capacitors may be integrated into semiconductor devices and used as charge reservoirs to prevent unwanted drop or rise in power supply. Existing decoupling capacitors for semiconductor devices have been generally adequate for their intended purposes, but they have not been entirely satisfactory in all respects.

SUMMARY

Some embodiments of the present disclosure provide a semiconductor device. An embodiment of the present disclosure provides a semiconductor device, which includes a substrate and at least one capacitor element. The capacitor element is on the substrate. The capacitor element includes a first electrode with a first pad and first terminals connected to the first pad, wherein the first terminals extend away from the substrate; and a second electrode with a second pad and second terminals connected to the second pad, wherein the second terminals extend toward the substrate, wherein the first terminals and the second terminals are staggered and separated by an interlayer dielectric layer.

Another embodiment of the present disclosure provides a semiconductor device, which includes a substrate and at least one capacitor element on each of the opposite surfaces of the substrate. Each capacitor element includes a first electrode with a first pad and first terminals connected to the first pad, wherein the first terminals extend away from the substrate; and a second electrode with a second pad and second terminals connected to the second pad, wherein the second terminals extend toward the substrate, wherein the first terminals and the second terminals are staggered and separated by an interlayer dielectric layer.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
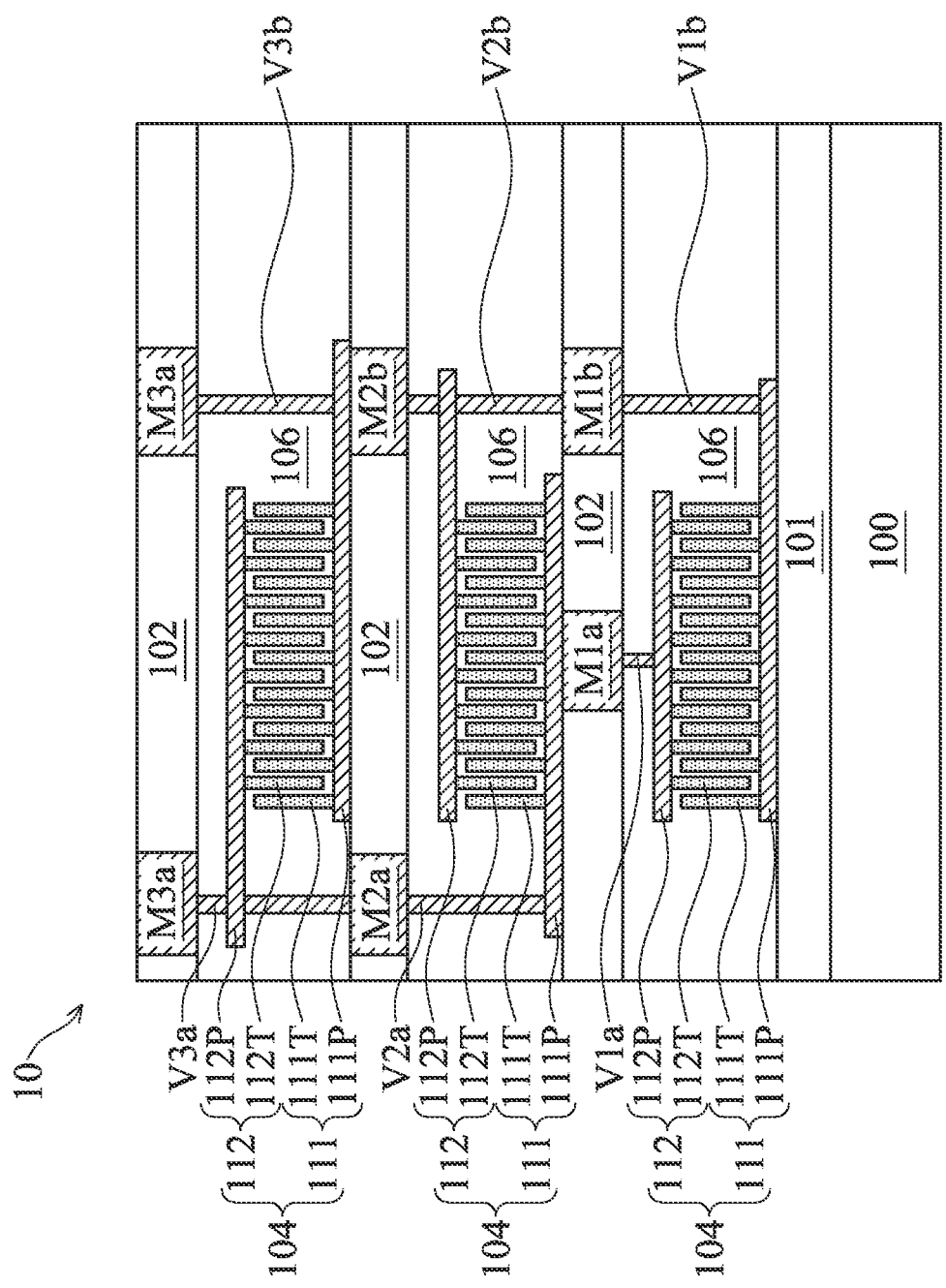
FIGS. 1-3 illustrate schematic cross-sectional views of a semiconductor device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Additionally, in some embodiments of the present disclosure, terms concerning attachments, coupling and the like, such as "connected" and "interconnected", refer to a relationship wherein structures are secured or attached to one another either directly or indirectly through intervening structures, as well as both movable or rigid attachments or relationships, unless expressly described otherwise. In addition, the term "coupled" include any method of direct and indirect electrical connection.

Further, spatially relative terms, such as "beneath," "below," "lower," "above," "upper" and the like, may be used herein for ease of description to describe one element or feature's relationship to another element or feature as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms "about", "approximately", and "roughly" typically mean±20% of the stated value, or ±10% of the stated value, or ±5% of the stated value, or ±3% of the stated value, or ±2% of the stated value, or ±1% of the stated value, or ±0.5% of the stated value. The stated value of the present disclosure is an approximate value. When there is no specific description, the stated value includes the meaning of "about", "approximately", and "roughly". The terminology used herein is for the purpose of describing particular embodiments only and is not intended to limit the invention. As used herein, the singular terms "a," "an" and "the" are intended to include the plural forms as well, unless the context clearly indicates otherwise.

Some embodiments of the disclosure are described below. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

As the performance of semiconductor devices have been improved, larger currents at higher frequencies but with lower power supply are demanded by these high-performance semiconductor devices. In such conditions, the design of power system becomes increasingly challenging. For example, the impact of power supply noise on the performance of semiconductor devices is critical and should be addressed. The present disclosure provides a semiconductor device with at least one capacitor element as a decoupling capacitor to prevent power supply noise (such as unwanted rise or drop in power supply) in the semiconductor device. In some embodiments, a high-density capacitor element is provided to achieve higher capacitance for the decoupling capacitor and higher compactness of the semiconductor device.

Figure 2:
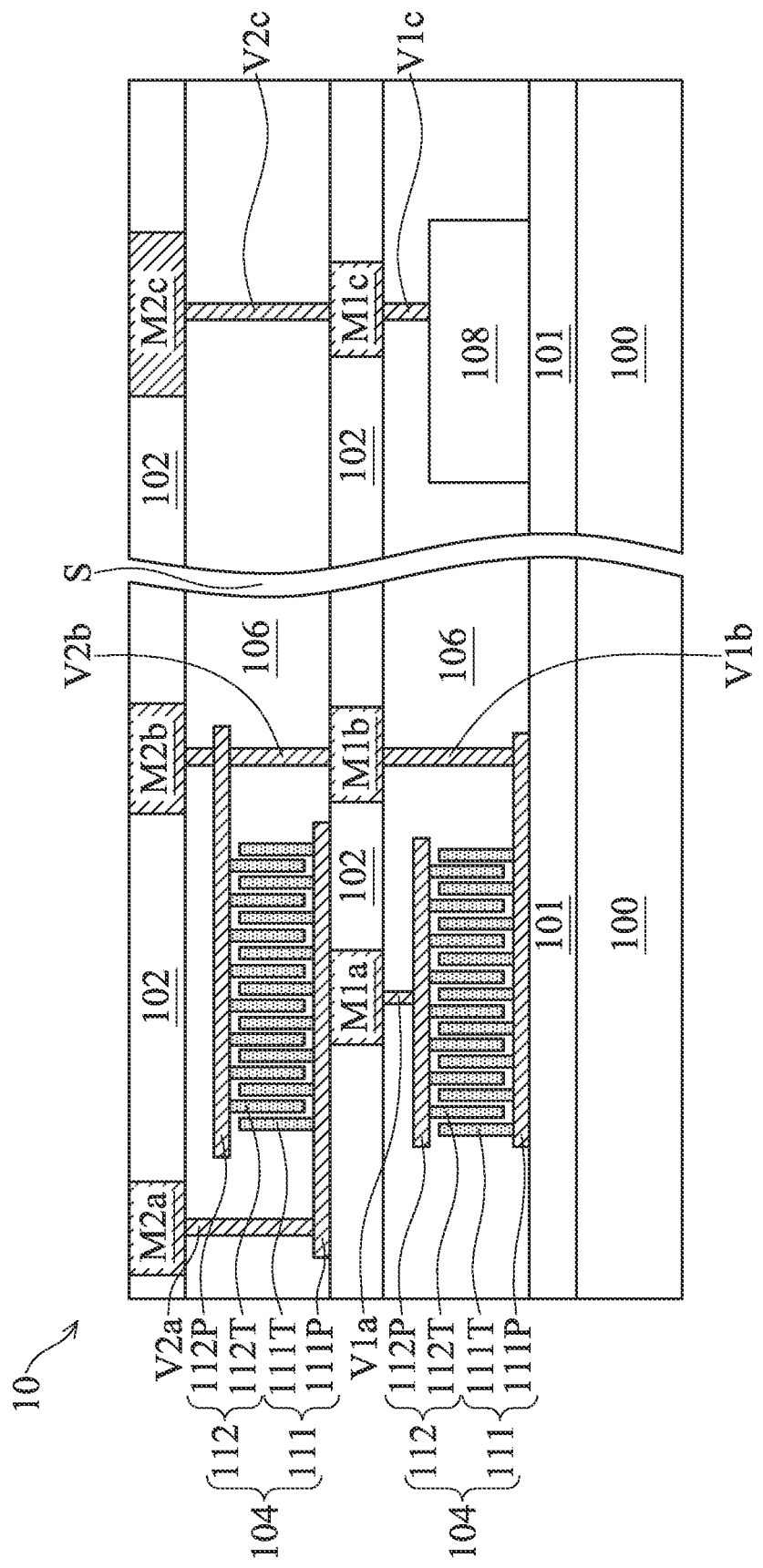
Figure 3:
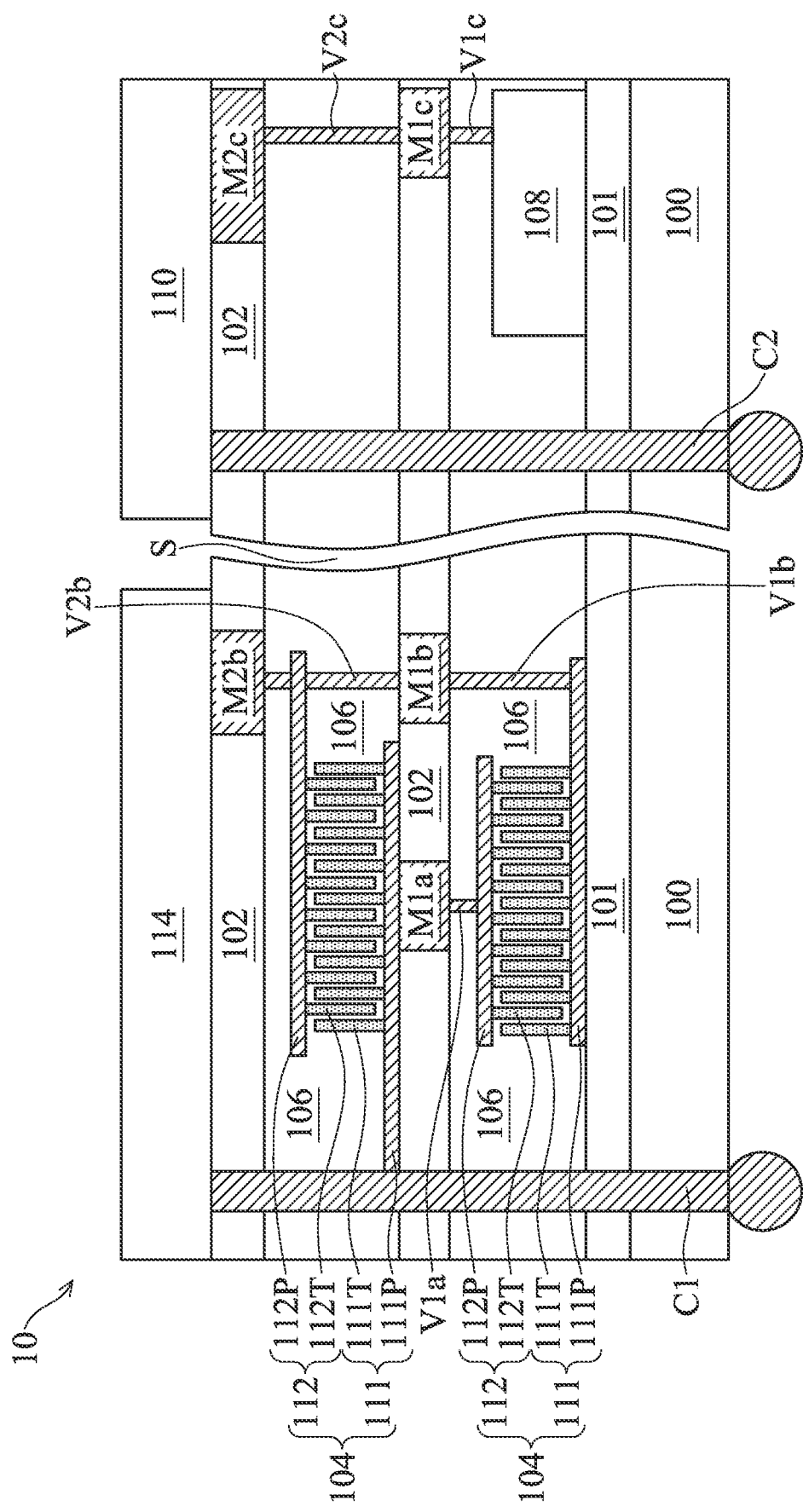

FIGS. 1-3 illustrate schematic cross-sectional views of a semiconductor device, in accordance with some embodiments of the present disclosure. Referring to FIG. 1, semiconductor device 10 includes a substrate 100 and at least one capacitor element 104 on the substrate 100. The substrate 100 may include an elementary (single element) semiconductor, such as silicon or germanium in a crystalline structure; a compound semiconductor, such as silicon carbide (SiC), gallium arsenide (GaAs), gallium phosphide (GaP), indium phosphide (InP), indium arsenide (InAs), and/or indium antimonide (InSb); an alloy semiconductor such as SiGe, GeC, GaAsP, AlInAs, AlGaAs, GaInAs, GaInP, and/or GaInAsP; a non-semiconductor material, such as soda-lime glass, fused silica, fused quartz, and/or calcium fluoride ($CaF_2$); and/or combinations thereof. For example, the material of the elementary semiconductor may include monocrystalline silicon (Si), polycrystalline silicon (poly-Si), amorphous silicon (a-Si), germanium (Ge), and/or carbon (C) (e.g. diamond).

The capacitor element 104 includes a first electrode 111 and a second electrode 112. In some embodiments, the first electrode 111 and the second electrode 112 are formed as a first comb-shaped structure and a second comb-shaped structure, respectively. The first electrode 111 is configured to have a first pad 111P and a plurality of first terminals 111T connected to the first pad 111P. The first terminals 111T extend away from the substrate 100. The second electrode 112 is configured to have a second pad 112P and second terminals 112T connected to the second pad 112P. The second terminals 112T extend toward the substrate 100. In some embodiments, the extension directions of the first terminals 111T and the second terminals 112T are parallel. As shown in FIG. 1, the first terminals 111T and the second terminals 112T are staggered and separated by an interlayer dielectric layer 106. In some embodiments, the terminals 111T and the second terminals 112T are alternately arranged in a horizontal direction parallel to the surface of the substrate 100 and extend between the first pad 111P and the second pad 112P in a vertical direction with respect to the surface of the substrate 100. In some embodiments, the capacitor element 104 could be contained in a memory module, for example, a DRAM cell, but not limited.

In some embodiments, the method of forming the capacitor element 104 includes (but not limited to) depositing and patterning a material layer for the first pad 111P, depositing and patterning a material layer for the first terminals 111T on the first pad 111P (thereby forming the first electrode 111 of the capacitor element 104), depositing a material layer for the interlayer dielectric layer 106, patterning the material layer for the interlayer dielectric layer 106 to form openings, depositing a material layer for the second terminals 112T in the openings, depositing and patterning a material layer for the second pad 112P on the second terminals 112T (thereby forming the second electrode 112 of the capacitor element 104). In some embodiments, patterning the material layer for the interlayer dielectric layer 106 to form openings may include etching (e.g. dry etching, wet etching, reactive ion etching (RIE)) the material layer to form the openings. In some embodiments, a planarization process such as chemical mechanical polishing (CMP) process may be performed to remove excess material layer for the second terminals 112T outside the openings after depositing the material layer for the second terminals 112T in the openings.

The material of the first pad 111P and the second pad 112P may include a conductive material, such as metal, metal nitride, metal oxide, metal alloy, doped polysilicon or another suitable conductive material, a combination thereof. For example, the metal may include Au, Ni, Pt, Pd, Ir, Ti, Cr, W, Al, Cu, or another suitable material; the metal nitride may include MoN, WN, TiN, TaN, TaSiN, TaCN, TiAlN, or another suitable material. In some embodiments, the first pad 111P and the second pad 112P may include the same material. In other embodiments, the first pad 111P and the second pad 112P may include different materials. The material layer for the first pad 111P and the second pad 112P may be deposited by chemical vapor deposition (CVD) process, physical vapor deposition (PVD) process, atomic layer deposition (ALD) process, or the like. The material of the first terminals 111T and the second terminals 112T may be high-k material including, for example, metal oxide or metal nitride. In some embodiments, the high-k material may include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, and/or combinations thereof. The material layer for the first terminals 111T and the second terminals 112T may be deposited by any suitable method, such as CVD process, plasma-enhanced CVD (PECVD) process, spin-on-glass process, a combination thereof, or the like. In some embodiments, the first terminals 111T and the second terminals 112T may include the same material. In other embodiments, the first terminals 111T and the second terminals 112T may include different materials. According to some embodiments of the present disclosure, the first pad 111P and the second pad 112P may each include Cu, W, or SiGe, and the first terminals 111T and the second terminals 112T may each include TiN or TaN.

The interlayer dielectric layer 106 (or may be referred to inter-metal dielectric (IMD) may include a dielectric material (e.g., a semiconductor oxide, a semiconductor nitride, a semiconductor oxynitride, a semiconductor carbide, etc.), SOG, fluoride-doped silicate glass (FSG), phosphosilicate glass (PSG), borophosphosilicate glass (BPSG), xerogel, aerogel, amorphous fluorinated carbon, parylene, benzocyclobutene (BCB), and/or combinations thereof. The interlayer dielectric layer 106 may be form by CVD process, ALD process, PECVD process, high-density CVD process, PVD process, one or more other applicable processes, or a combination thereof.

In some embodiments, the semiconductor device 10 includes a dielectric layer 101 disposed between the substrate 100 and the capacitor element 104. The dielectric layer 101 may be single layer or multilayer structure including dielectric material formed of semiconductor oxide, semiconductor nitride, semiconductor oxynitride, semiconductor carbide or combinations thereof. The dielectric layer 101 may be formed by CVD process, ALD process, PVD process, one or more other applicable processes, or a combination thereof.

According to some embodiments of the present disclosure, the semiconductor device 10 includes a plurality of capacitor elements 104 successively stacked on the substrate 100. In some embodiments, the capacitor elements 104 are successively stacked on the dielectric layer 101. The successively stacked capacitor elements 104 with the first electrode 111 and the second electrode 112 may form more compact capacitors and may be used as decoupling capacitors to provide a higher capacitance than conventional decoupling capacitors. The capacitance provided by the capacitor elements 104 of some embodiments of the present disclosure may be greater than 2.5 times of the capacitance provided by a conventional decoupling capacitor. For example, the conventional decoupling capacitor (such as cylinder-shaped or plate-shaped decoupling capacitor) of thickness 100 μm may provide a value about 600-1300 $nF/mm^2$ (capacitance/area), while the capacitor elements 104 having the first electrode 111 and the second electrode 112 of thickness less than 100 μm may provide a value greater than 1200-2600 $nF/mm^2$ (capacitance/area). The capacitor elements 104 of some embodiments of the present disclosure has a higher value of capacitance/area and a smaller thickness and may be used as a decoupling capacitor for semiconductor device 10. As a result, power supply noises in the semiconductor device 10 may be prevented due to higher value of capacitance/area provided by the capacitor elements 104. Furthermore, since the thickness of the semiconductor device 10 with the decoupling capacitor (i.e. the capacitor elements 104) is reduced, the parasitic inductance and resistance will be reduced.

In some embodiments, the semiconductor device 10 may include one or more dielectric layers 102 between a lower one of the capacitor elements 104 and an upper one of the capacitor elements 104. As shown in FIG. 1, conductive layers M1a/M1b, M2a/M2b, and M3a/M3b are disposed in the respective dielectric layers 102, and vias V1a/V1b, V2a/V2b, and V3a/V3b are disposed in the respective interlayer dielectric layers 106. In some embodiments, the first pad 111P of the lower one of the capacitor elements 104 is connected to the second pad 112P of the upper one of the capacitor elements 104 through, for example, the via V1b, the conductive layer M1b, and the via V2b, and the second pad 112P of the lower one of the capacitor elements 104 is connected to the first pad 111P of the upper one of the capacitor elements 104 through, for example, the via V1a and the conductive layer M1a. The number of capacitor elements 104 successively stacked on the substrate 100 is not particularly limited. The number may be two, six, twenty one, or up to fifty or more. In some embodiments, the overall thickness of the semiconductor device 10 with the capacitor elements 104 is less than 150 μm. The successively stacked capacitor elements 104 may form a high-density decoupling capacitor in the semiconductor device 10 and provide a greater capacitance than conventional decoupling capacitors. In addition, the thickness of the decoupling capacitor formed by the capacitor elements 104 is less than the conventional decoupling capacitors. Therefore, the resulting semiconductor device with the capacitor elements 104 is thinner than those semiconductor devices with conventional decoupling capacitors and a better heat dissipation of the resulting semiconductor device may be achieved.

Referring to FIG. 2, the capacitor elements 104 and an IC element 108 may be integrated on the same substrate 100. For simplicity, like features in FIG. 2 and FIG. 1 are designated with like reference numerals and some of the description is not repeated. The separation mark S represents one or more elements may be disposed between the capacitor elements 104 and the IC element 108, or, in some embodiments, the capacitor elements 104 is adjacent to the IC element 108 and no other element is disposed therebetween. The IC element 108 may include a memory device, a graphics processing unit (GPU), a central processing unit (CPU), or any other processing unit or control unit. In some embodiments, the IC element 108 may be connected to the capacitor elements 104 via interconnections (not shown) to prevent noise from the power supply of the IC element 108. It should be noted that the IC element 108 disposed between dielectric layer 101 and dielectric layer 102 is merely illustrative. In some embodiments, the IC element 108 may be disposed on the dielectric layer 102 and be substantially on the same level as the capacitor elements 104. In some embodiments, the IC element 108 may be connected to another element through the via Vic, the conductive layer M1c, the via V2c, and the conductive layer M2c.

Referring to FIG. 3, the semiconductor device 10 includes a main logic die containing IC elements 110 and 114 attached on the dielectric layer 102, in accordance with some embodiments of the present disclosure. For simplicity, like features in FIG. 3 and FIGS. 1 and 2 are designated with like reference numerals and some of the description is not repeated. The IC elements 110 and 114 may include memory, a graphics processing unit (GPU), a central processing unit (CPU), or a combination thereof. The semiconductor device 10 may include connection features C1 and C2 which penetrate through the substrate 100. In further embodiments, the connection features C1 and C2 penetrate through the dielectric layer 102, the interlayer dielectric layer 106, the dielectric layer 101 and the substrate 100, and extend beneath a bottom surface of the substrate 100. In some embodiments, the connection features C1 and C2 may be connected to respective solder bumps below the substrate 100. In some embodiments, the connection features C1 and C2 may be connected to the IC elements 114 and 110 respectively. In some embodiments, the connection features C1 and C2 may be bonded to, for example, a printed circuit board (PCB). In some embodiments, the second pad 111P of one of the capacitor elements 104 may be connected to the connection feature C1. In some embodiment, the connection features C1 and C2 may be formed by a method including through silicon via (TSV) technique. The main logic die including IC elements 110 and 114, the capacitor elements 104, the IC element 108 are integrated on the same substrate 100. This integration may be referred to heterogeneous integration, which represents an integration of system on chips (SoC), memories, power supply, power management, and/or other components. In some embodiments, the semiconductor device 10 may include plural sets of the capacitor elements 104 disposed on the substrate 100, and each of the plural sets of the capacitor elements may be respectively connected to components heterogeneously integrated in the semiconductor device 10. Accordingly, the plural sets of the capacitor elements 104 may be used as decoupling capacitors to provide higher capacitance for the components. Furthermore, the thickness of the semiconductor device 10 with the plural sets of the capacitor elements (used as decoupling capacitors) is less than the thickness of the semiconductor device with the conventional decoupling capacitors. For example, one embodiment of the present disclosure may provide a decoupling capacitor of thickness equal to or less than 100 μm with a value greater than 2600 nF/mm² (capacitance/area), while the thickness of the conventional decoupling capacitor may need to be greater than 260 μm so that a value greater than 2600 nF/mm² (capacitance/area) may be achieved. Therefore, according to some embodiments of the present disclosure, parasitic inductance and resistance of heterogeneous integration with decoupling capacitors may be reduced by providing thinner decoupling capacitors. In some embodiments, the IC element 108 may include memory and the IC element 110 may include CPU. In such embodiments, the performance of the semiconductor device may be improved due to shorter physical path for data communication between CPU and memory.

Figure 4:
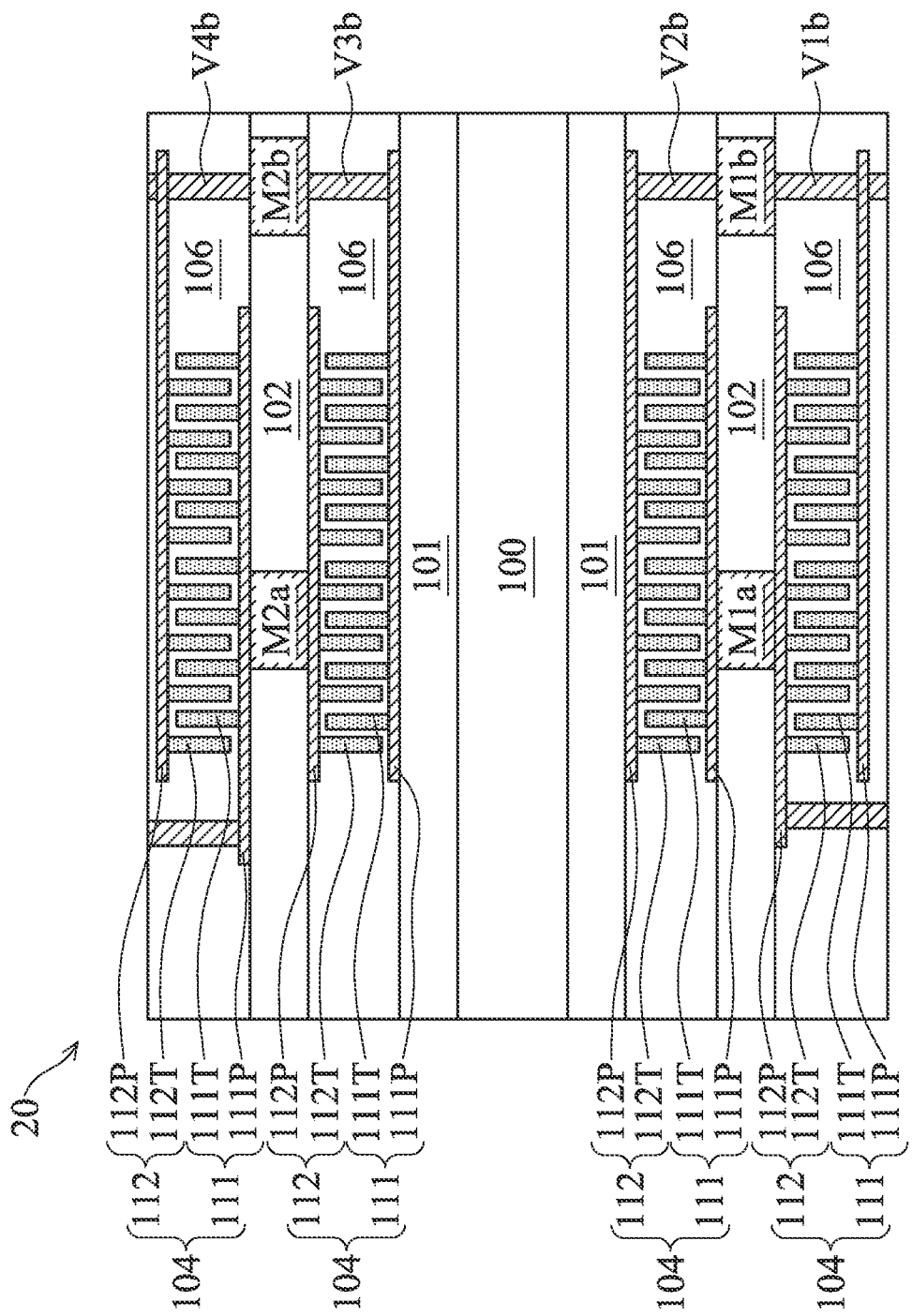
FIGS. 4-6 illustrate schematic cross-sectional views of a semiconductor device, in accordance with other embodiments of the present disclosure.
Figure 5:
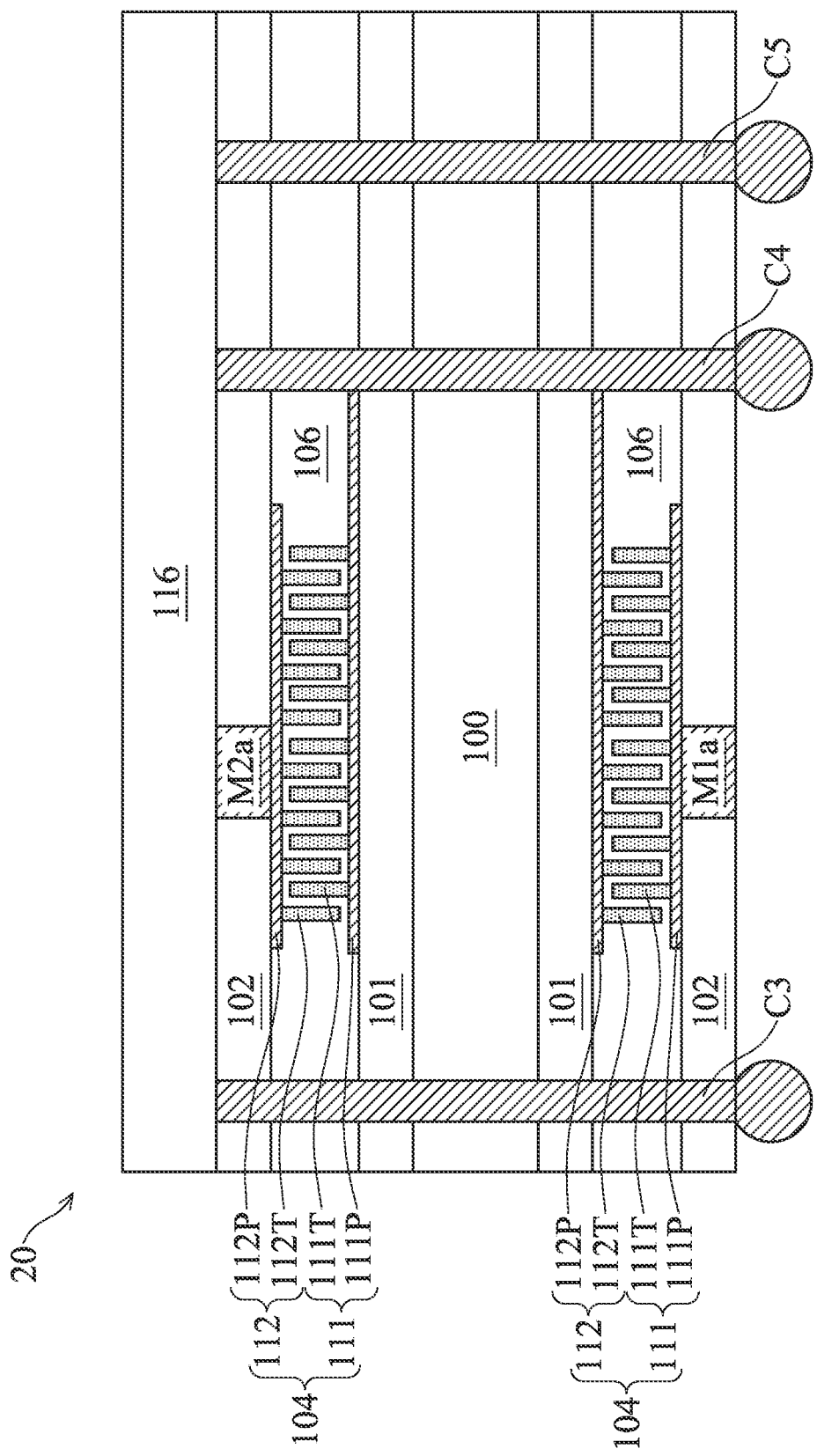
Figure 6:
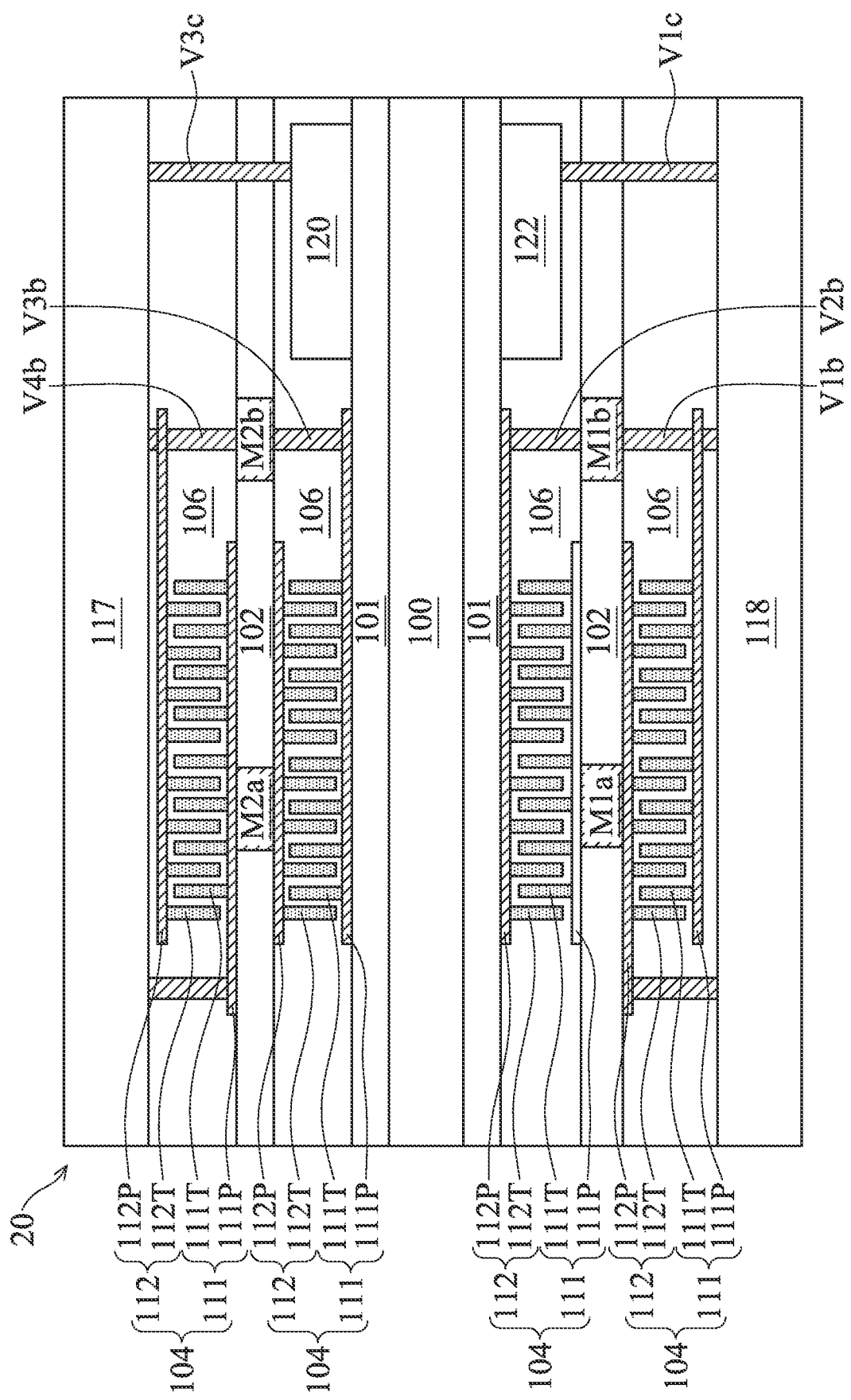

FIGS. 4-6 illustrate schematic cross-sectional views of a semiconductor device, in accordance with other embodiments of the present disclosure. Referring to FIG. 4, the semiconductor device 20 includes the substrate 100 and at least one capacitor element 104 on each of the opposite surfaces of the substrate 100. For simplicity, like features in semiconductor device 20 and semiconductor device 10 are designated with like reference numerals and some of the description is not repeated. The capacitor element 104 of the semiconductor device 20 includes a first electrode 111 and a second electrode 112. The first electrode 111 is configured to have a first pad 111P and first terminals 111T connected to the first pad 111P. The first terminals 111T extend away from the substrate 100. The second electrode 112 is configured to have a second pad 112P and second terminals 112T connected to the second pad 112P. The second terminals 112T extend toward the substrate 100. As shown in FIG. 4, the first terminals 111T and the second terminals 112T are staggered and separated by the interlayer dielectric layer 106. The material of the first pad 111P and the second pad 112P may include a conductive material, such as metal, metal nitride, metal oxide, metal alloy, another suitable conductive material, a combination thereof. The material of the first terminals 111T and the second terminals 112T may be high-k material including, for example, metal oxide or metal nitride. The method of forming the capacitor element 104 of the semiconductor device 20 is similar to the method described above with respect the semiconductor device 10 in FIG. 1.

In some embodiments, the capacitor element 104 includes a plurality of capacitor elements 104 successively stacked on each of the opposite surfaces the substrate 100. In some embodiments, the sum of the thickness of each of the capacitor elements 104 is less than 100 μm. In some embodiments, the thickness of each of the capacitor elements 104 is about 2 μm. In some embodiments, the thickness of the semiconductor device 20 with the capacitor elements 104 is less than 150 μm. The successively stacked capacitor elements 104 may form high-density capacitors on the opposite surfaces of the substrate 100 and may be used as decoupling capacitors to provide higher capacitance than conventional decoupling capacitors. Therefore, power supply noises in the semiconductor device 20 may be prevented more effectively than conventional decoupling capacitors.

In some embodiments, the semiconductor device 20 may include one or more dielectric layers 102 between a lower one of the capacitor elements 104 and an upper one of the capacitor elements 104. As shown in FIG. 4, conductive layers M1a/M1b and conductive layers M2a/M2b are disposed in the respective dielectric layers 102, and vias V1b, V2b, V3b, and V4b are disposed in the respective interlayer dielectric layers 106. In some embodiments, for capacitor elements 104 below the lower surface of the semiconductor device 20, the first pad 111P of the lower one of the capacitor elements 104 is connected to the second pad 112P of the upper one of the capacitor elements 104 through, for example, the via V1b, the conductive layer M1b, and the via V2b, and the second pad 112P of the lower one of the capacitor elements 104 is connected to the first pad 111P of the upper one of the capacitor elements 104 through, for example, the conductive layer M1a. Similarly, in some embodiments, for capacitor elements 104 on the upper surface of the semiconductor device 20, the first pad 111P of the lower one of the capacitor elements 104 is connected to the second pad 112P of the upper one of the capacitor elements 104 through, for example, the via V3b, the conductive layer M2b, and the via V4b, and the second pad 112P of the lower one of the capacitor elements 104 is connected to the first pad 111P of the upper one of the capacitor elements 104 through, for example, the conductive layer M2a. The number of capacitor elements 104 successively stacked on the opposite surfaces of the substrate 100 is not particularly limited. The number may be one, eleven, thirty, or up to fifty or more.

Referring to FIG. 5, the embodiment describes a hybrid structure formed by techniques of at least two wafers bonding, the semiconductor device 20 includes a main logic die containing an IC element 116 attached on the dielectric layer 102, in accordance with other embodiments of the present disclosure. For simplicity, like features in FIG. 5 and FIG. 4 are designated with like reference numerals and some of the description is not repeated. The IC element 116 may include memory, a graphics processing unit (GPU), a central processing unit (CPU), or a combination thereof. The semiconductor device 20 may include connection features C3, C4, and C5 which may be bonded to, for example, a printed circuit board (PCB). In some embodiment, the connection features connection features C3, C4, and C5 may be formed by a method including through silicon via (TSV) technique. As shown in FIG. 5, the second pad 112P of the lower one of the capacitor elements 104 is connected to the first pad 111P of the upper one of the capacitor elements 104 through the connection feature C4 in some embodiments.

Referring to FIG. 6, the embodiment describes a hybrid structure formed by techniques of at least three wafers bonding, the semiconductor device 20 includes a main logic die containing an IC element 117 attached to the interlayer dielectric layer 106 on the upper surface of the substrate 100 and another main logic die containing an IC element 118 attached to the interlayer dielectric layer 106 under the lower surface of the substrate 100, in accordance with other embodiments of the present disclosure. In some embodiments, the main logic die containing an IC element 117 is attached to the interlayer dielectric layer 106 on the topmost capacitor element 104 and the main logic die containing an IC element 118 is attached to the interlayer dielectric layer 106 under the bottommost capacitor element 104. For simplicity, like features in FIG. 6 and FIG. 4 are designated with like reference numerals and some of the description is not repeated. In some embodiments, the semiconductor device 20 may include an IC element 120 connected to the IC element 117 through via V3c and an IC element 122 connected to the IC element 118 through via Vic. FIG. 6 illustrates another example of heterogeneous integration, where two main logic dies are respectively attached to the respective interlayer dielectric layers 106 above and/or below the least one capacitor element on the opposite surfaces of the substrate 100, in accordance with some embodiments of the present disclosure. In such embodiments of heterogeneous integration, the semiconductor device 20 may be thinner and more compact since the components are integrated on opposite sides of the same substrate 100, and the communication between components is more efficient due to shorter physical paths among the components are provided.

The embodiments of the present disclosure provide many benefits to a semiconductor device. For example, the power supply noises in the semiconductor device may be prevented by the capacitor elements more effectively and a stable power supply is achieved. The capacitor elements may form high-density decoupling capacitors to provide thinner decoupling capacitors for the semiconductor device. In addition, this may improve heat dissipation in the semiconductor device with decoupling capacitors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a substrate;
    at least one capacitor element on the substrate, wherein the at least one capacitor element comprises:
        a first electrode with a first pad and first terminals connected to the first pad, wherein the first terminals extend away from the substrate; and
        a second electrode with a second pad and second terminals connected to the second pad, wherein the second terminals extend toward the substrate, wherein the first terminals and the second terminals are staggered and separated by an interlayer dielectric layer; and
    a connection feature penetrating through the interlayer dielectric layer and the substrate, wherein the connection feature extends to reach a bottom surface of the substrate, and the first pad of one of the at least one capacitor element is connected to the connection feature.

2. The semiconductor device as claimed in claim 1, further comprising a dielectric layer between the substrate and the at least one capacitor element.

3. The semiconductor device as claimed in claim 1, wherein the at least one capacitor element comprises a plurality of capacitor elements successively and vertically stacked on the substrate, and each of the plurality of capacitor elements comprises the first electrode with the first pad and the first terminals and the second electrode with the second pad and the second terminals.

4. The semiconductor device as claimed in claim 3, wherein the first pad of a lower one of the capacitor elements is connected to the second pad of an upper one of the capacitor elements.

5. The semiconductor device as claimed in claim 4, wherein the second pad of the lower one of the capacitor elements is connected to the first pad of the upper one of the capacitor elements.

6. The semiconductor device as claimed in claim 5, further comprising a dielectric layer between the lower one of the capacitor elements and the upper one of the capacitor elements, and a conductive layer in the dielectric layer.

7. The semiconductor device as claimed in claim 1, further comprising a first IC element on the substrate, wherein the first IC element is substantially on a same level as the at least one capacitor element, and the first IC element is connected to the connection feature.

8. The semiconductor device as claimed in claim 7, wherein the first IC element comprises memory, a graphics processing unit (GPU), a central processing unit (CPU), or a combination thereof.

9. The semiconductor device as claimed in claim 8, further comprising a second IC element over and connected to the first IC element, and a third IC element over the at least one capacitor element.

10. The semiconductor device as claimed in claim 9, wherein the second IC element and the third IC element each comprises memory, a graphics processing unit (GPU), a central processing unit (CPU), or a combination thereof.

* * * * *